United States Patent
Lee et al.

(10) Patent No.: US 6,778,000 B2
(45) Date of Patent: Aug. 17, 2004

(54) INTEGRATED CIRCUIT DEVICES THAT PROVIDE CONSTANT TIME DELAYS IRRESPECTIVE OF TEMPERATURE VARIATION

(75) Inventors: Doo-Seop Lee, Kyunggi-do (KR); Seung-Keun Lee, Kyunggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/357,695

(22) Filed: Feb. 4, 2003

(65) Prior Publication Data

US 2003/0193360 A1 Oct. 16, 2003

(30) Foreign Application Priority Data

Apr. 12, 2002 (KR) ................. 10-2002-0019946

(51) Int. Cl.[7] ................................. G06G 7/12
(52) U.S. Cl. ....................... 327/362; 327/281
(58) Field of Search ................. 327/261, 262, 327/263, 264, 281, 288, 231, 378, 513, 512; 326/32; 257/536, 537

(56) References Cited

U.S. PATENT DOCUMENTS

| | | | |
|---|---|---|---|
| 4,746,823 A | | 5/1988 | Lee .......................... 327/363 |
| 5,448,103 A | * | 9/1995 | De Wit ...................... 257/536 |
| 5,598,111 A | * | 1/1997 | Enomoto .................... 326/83 |
| 6,284,599 B1 | * | 9/2001 | Mehrad et al. ............. 438/257 |
| 6,580,287 B2 | * | 6/2003 | Hsu et al. ................... 326/32 |

FOREIGN PATENT DOCUMENTS

| | | | |
|---|---|---|---|
| JP | 359161106 | * | 9/1984 |
| JP | 11-220333 | | 8/1999 |

* cited by examiner

*Primary Examiner*—Dinh T. Le
(74) *Attorney, Agent, or Firm*—Myers Bigel Sibley & Sajovec

(57) ABSTRACT

A delay circuit is provided including first and second resistive elements electrically coupled in series having first and second resistance values. The first resistance value varies in proportion to temperature and the second resistance value varies in inverse proportion to temperature.

9 Claims, 3 Drawing Sheets

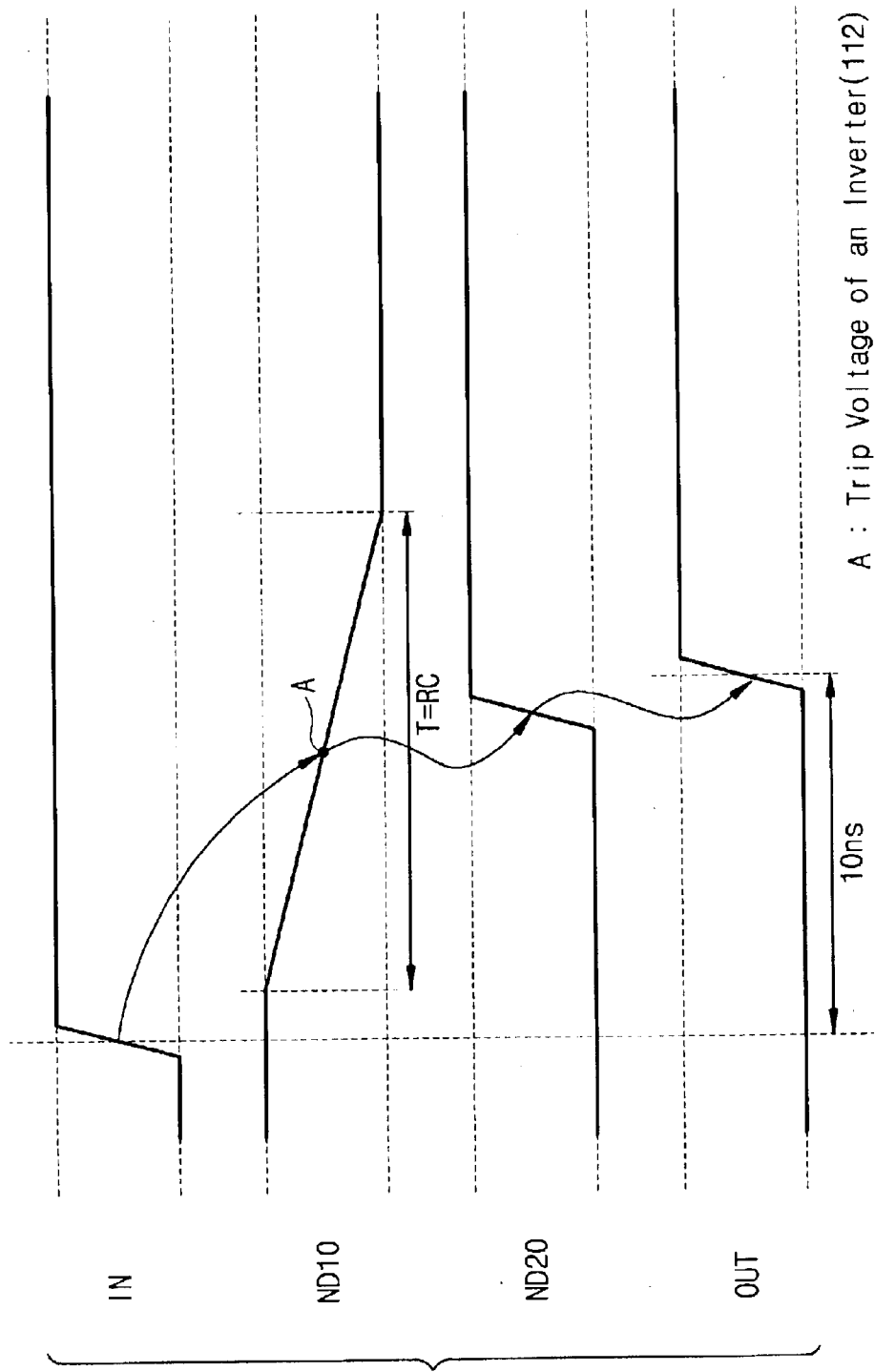

INTEGRATED CIRCUIT DEVICES THAT PROVIDE CONSTANT TIME DELAYS IRRESPECTIVE OF TEMPERATURE VARIATION

RELATED APPLICATION

This application is related to and claims priority from Korean Application No. 2002-19946, filed on Apr. 12, 2002, the disclosure of which is hereby incorporated herein by reference as if set forth in its entirety.

FIELD OF THE INVENTION

The present invention is related to integrated circuit devices and, more particularly, to integrated circuit devices including delay circuits that delay an input signal by a predetermined time.

BACKGROUND OF THE INVENTION

Signal delay circuits or pulse generating circuits have been used in integrated circuit devices for various purposes, such as signal control. Such signal delay or pulse generating circuits are typically formed using a delay circuit. Generally, the width of a pulse signal is dependant upon a delay time of a delay circuit. Accordingly, it may be important to control the delay time of the delay circuit in order to obtain an accurate pulse width. The delay time may be controlled using a time constant that is determined using the values of one or more resistors and capacitors in the delay circuit. A resistor may be formed of polysilicon, for example, a polysilicon resistor, and a capacitor may be formed using a gate capacitance of a transistor.

The gate capacitance of the transistor is typically dependent upon the thickness of its gate oxide film, thus, possibly making it difficult to freely adjust the capacitance per the unit area. The area occupied by the capacitor in a chip may be relatively large as compared with the area occupied by the resistor. For this reason, gate capacitance is determined so as to ignore parasitic capacitance and the time constant of a delay circuit is adjusted using a resistor whose sheet resistance can be controlled relatively easily and whose chip area is small relative to the chip area of the capacitor.

Unfortunately, since a polysilicon resistor is susceptible to temperature variation, it may be difficult to form a polysilicon resistor that has a constant resistance value as the temperature of the integrated circuit device increases and/or decreases. This variation in the resistance value of a polysilicon resistor caused by the temperature variation may, therefore, introduce inaccuracy into the control signals that are used in integrated circuit devices.

SUMMARY OF THE INVENTION

Embodiments of the present invention provide integrated circuit devices including delay circuits having first and second resistive elements electrically coupled in series having first and second resistance values. The first resistance value varies in proportion to temperature and the second resistance value varies in inverse proportion to temperature.

In some embodiments of the present invention, the sum of the first and second resistance values may remain substantially constant as a temperature of the integrated circuit device increases and/or decreases.

In further embodiments of the present invention, the ratio of the first resistance value to the second resistance value is 2:1. In certain embodiments of the present invention, a change ratio of a resistance rate of change of the first resistive element to a resistance rate of change of the second resistive element is 1:2. The first and second resistive elements may include first and second resistors.

In still further embodiments of the present invention, the integrated circuit device may be an integrated circuit memory device. In certain embodiments, the memory device may include a flash memory device, the first resistive element may comprise a floating gate of the flash memory device that includes lightly doped polysilicon and the second resistive element may comprises a control gate of the flash memory device that includes highly doped polysilicon. The lightly doped polysilicon may have an impurity concentration of from about $1\times10^{16}$ to about $1\times10^{18}$ and the highly doped polysilicon may have an impurity concentration of about $1\times10^{20}$.

BRIEF DESCRIPTION OF THE DRAWINGS

FIG. 2 is a diagram illustrating waveforms at nodes of integrated circuit devices according to embodiments of the present invention, for example, embodiments illustrated in FIG. 1;

DETAILED DESCRIPTION OF EMBODIMENTS OF THE PRESENT INVENTION

Figure 1:
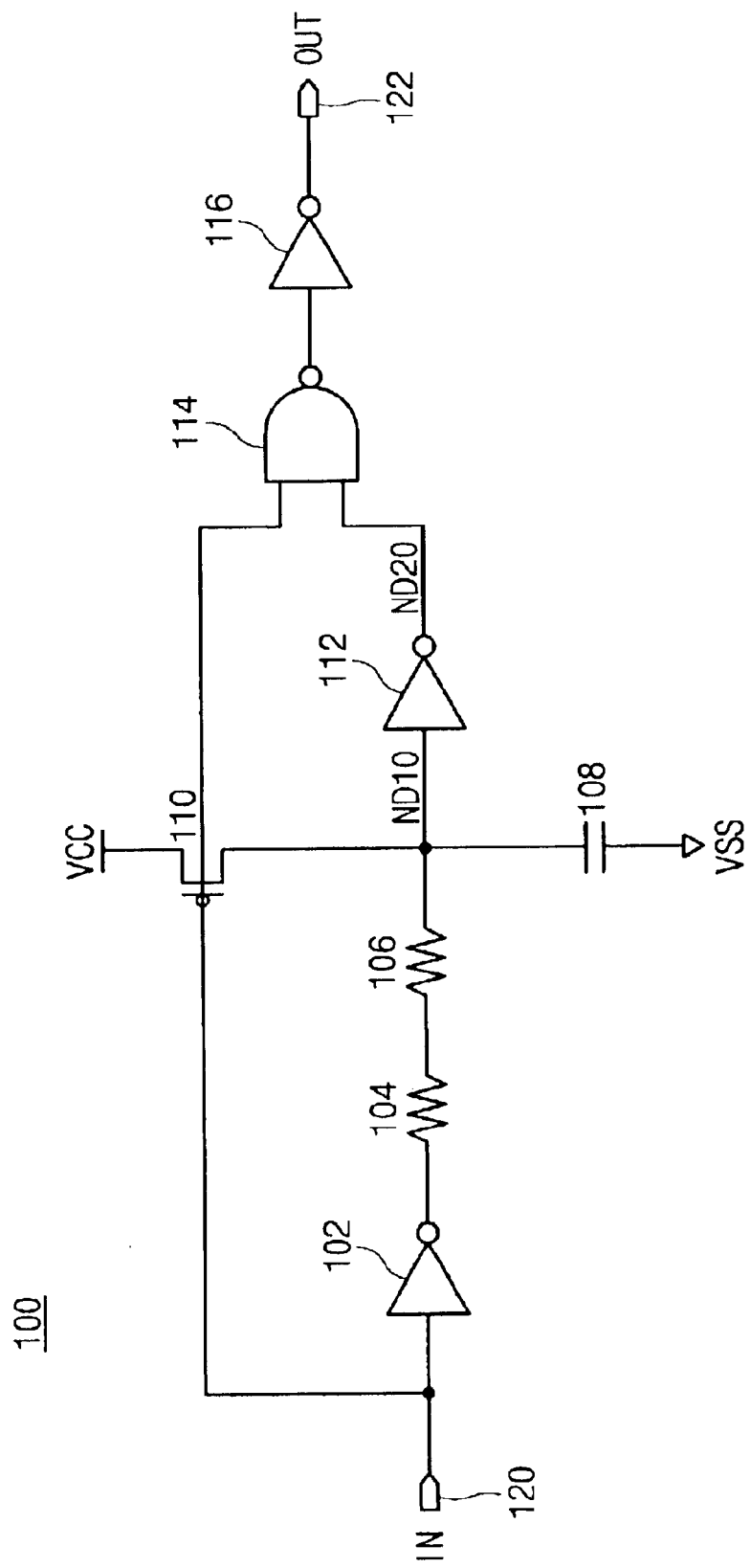
FIG. 1 is a circuit diagram illustrating integrated circuit devices according to embodiments of the present invention.

The present invention now will be described more fully with reference to the accompanying drawings, in which embodiments of the invention are shown. This invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like reference numerals refer to like elements throughout.

It will be understood that although terms such as first, second etc. are used herein to describe various elements, these elements should not be limited by these terms. These terms are only used to distinguish one element from another element. Thus, a first element discussed below could be termed a second element, and similarly, a second element may be termed a first element without departing from the teachings of the present invention.

Embodiments of the present invention will be described below with respect to FIGS. 1 through 3B. Embodiments of the present invention provide delay circuits having a substantially constant time delay irrespective of temperature variation. A resistive means is provided having a substantially constant resistance value irrespective of temperature. In certain embodiments, the resistive means is provided by first and second resistive elements electrically coupled in series having first and second resistance values. In these embodiments, the first resistance value varies in proportion to temperature and the second resistance value varies in inverse proportion to temperature. Thus, a sum of the first and second resistance values may remain substantially constant despite a variation in the temperature of the integrated circuit device. The ability to maintain a substantially constant resistance value may provide a substantially constant time delay for the integrated circuit device because a time constant of the integrated circuit device is partially based on the resistance of the integrated circuit. In particular, the time constant (T) of the integrated circuit device is determined using the equation T=RC, where R is resistance value. Accordingly, integrated circuits according to embodiments of the present invention may provide substantially constant resistance values and/or signal delay times in the presence of temperature variation.

Referring now to FIG. 1, a circuit diagram illustrating integrated circuit devices according to embodiments of the present invention will be discussed. As illustrated in FIG. 1, an integrated circuit device according to embodiments of the present invention includes a delay circuit 100. The delay circuit 100 receives an input signal IN and delays the input signal IN by a predetermined delay time. The delay circuit includes first, second and third inverters 102, 112, and 116, a first resistor 104, a second resistor 106, a capacitor 108, a PMOS transistor 110, and a NAND gate 114. The elements of the delay circuit 100 are electrically coupled as illustrated in FIG. 1.

In particular, the first inverter 102 receives and inverts an input signal IN via an input terminal 120. The first and second resistors 104 and 106 are connected in series between an output of the first inverter 102 and a first internal node ND10, and the capacitor 108 is connected between the first internal node ND10 and a ground voltage VSS. In certain embodiments, the first and second resistors 104 and 106 are formed of polysilicon and the capacitor 108 is formed using gate capacitance of a MOS transistor. Furthermore, the first and second resistors 104 and 106 can be formed using an active region of a semiconductor substrate, i.e., an active resistor.

The PMOS transistor 110 is coupled between a power supply voltage VCC and the first internal node ND10 and is turned on/off by the input signal IN that is applied to the input terminal 120. The second inverter 112 is connected between the first internal node ND10 and a second internal node ND20. In particular, the input of the second inverter 112 is connected to the first internal node ND10 and an output of the second inverter 112 is connected to the second internal node ND20. The NAND gate 114 has a first input terminal connected to receive the input signal IN and a second input terminal connected to the second internal node ND20. The third inverter 116 is connected between an output of the NAND gate 114 and an output terminal 122 for outputting an output signal OUT.

It will be understood that the circuit 100 illustrated in FIG. 1 is provided for exemplary purposes only and that embodiments of the present invention should not be limited to this configuration. For example, first and second resistors 104 and 106 are not limited to this configuration; alternatively, the first and second resistors 104 and 106 may be replaced by any element that provides a resistive means. Similarly, the capacitor 108 and the PMOS transistor 110 may be replaced with any element that provides the same or similar functionality without departing from the teachings of the present invention.

Referring now to FIG. 2, a waveform diagram illustrating operations of integrated circuits according to embodiments of the present invention illustrated in FIG. 1 will be discussed. As illustrated, when the input signal IN is at a low level of the ground voltage, charge current from a pull-up transistor (not shown) of the first inverter 102 flows into the first internal node ND10 via the first and second resistors 104 and 106. In particular, the capacitor 108 coupled to the first internal node ND10 is charged. The pull-up transistor of the first inverter 102 and the first and second resistors 104 and 106, form a charge path of the capacitor 108. As the PMOS transistor 110 is turned on, charge current from the transistor 110 is supplied to the capacitor 108 that is connected to the first internal node ND10. Since the second internal node ND20 is at the low level, the output signal OUT goes low.

As the input signal IN transitions from a low level to a high level, a pull-down transistor (not shown) of the first inverter 102 is turned on instead of the pull-up transistor (not shown) discussed above. The capacitor 108 discharges through the first and second resistors 104 and 106 and the pull-down transistor of the first inverter 102. The pull-down transistor of the first inverter 102 and the first and second resistors 104 and 106, form a discharge path of the capacitor 108. A time T, i.e., a time constant, for discharging the capacitor 108 is determined by the equation T=RC, where R is, for example, the sum of resistance values of the resistors 104 and 106 and C is a capacitance value of, for example, the capacitor 108. As charges in the capacitor 108 continue to discharge, a voltage of the first internal node ND10 is lowered toward the ground voltage VSS. If the voltage of the first internal node ND10 is lowered to a trip voltage of the second inverter 112, an output signal of the second inverter 112 transitions from a low level to a high level. When the output signal of the second inverter 112 has a low-to-high transition, an output signal of the NAND gate 114 goes low. Accordingly, the output signal OUT transitions from a low level to a high level. In certain embodiments, the input signal IN may be delayed by, for example, about 10 nanoseconds (ns), before the output signal OUT transitions from the low level to the high level.

A delay time of the input signal IN is dependant upon the time constant (T) that is determined by the resistance and capacitance values of the delay circuit (T=RC). In embodiments of the present invention illustrated in FIG. 1, the time constant (T) may be determined by the resistors 104 and 106 and the capacitor 108. The larger the time constant that is determined by the resistors 104 and 106 and the capacitor 108, the longer the delay time of the input signal IN. Similarly, the smaller the time constant, the shorter the delay time of the input signal IN. A resistance value typically varies responsive to an increase and/or decrease in temperature. Thus, by definition, the time constant may vary responsive to the temperature variation because, as discussed above, the time constant is determined based partially upon the resistance value of the integrated circuit. Accordingly, the delay time of an input signal, for example, the input signal IN, may vary responsive to an increase and/or decrease in temperature.

Figure 3A:
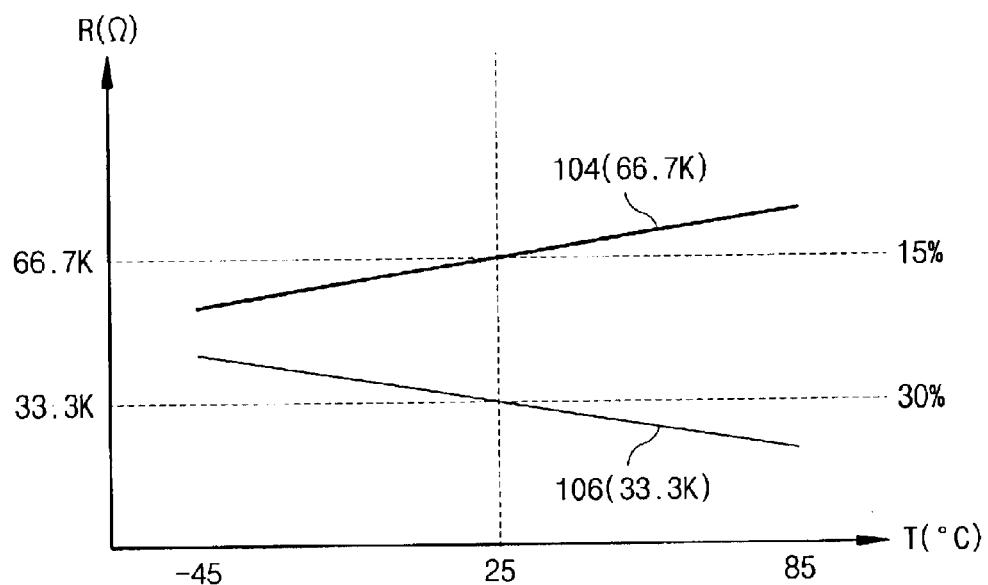
FIG. 3A is a diagram illustrating resistance variation of resistive elements according to embodiments of the present invention in accordance with temperature variation.

Variation of the above-described delay time responsive to temperature variation may be reduced by integrated circuits according to embodiments of the present invention as discussed below. For example, in FIG. 1, the first resistor 104 has a resistance value that varies in proportion to the temperature variation, while the second resistor 106 has a second resistance value that varies in inverse proportion to the temperature. For example, as illustrated in FIG. 3A, the first resistor 104 may have a resistance variation of about 15% in a range of −45° C. to +85° C., while the second resistor 106 has a resistance variation of about resistance change rate of the first resistor 104 to a resistance change rate of the second resistor 106 is 1:2 with respect to the temperature variation. Under this condition, a ratio of a resistance value of the first resistor 104 to a resistance value of the second resistor 106 becomes 2:1. For example, in a conventional delay circuit a resistor of 100 KΩ and a capacitor of 100 fF can be used to delay an input signal IN by about 10 ns. If this resistance value of 100 KΩ varies in accordance with temperature variation, a delay time of the conventional delay circuit also varies. Delay circuits according to embodiments of the present invention may make it possible to obtain a substantially constant resistance value irrespective of the temperature variations by using, for example, first and second resistors 104 and 106 having different resistance variation characteristics from each other as discussed above. Accordingly, the first resistor 104 can be set to have a resistance value of about, for example, 66.7 KΩ, and the second resistor 106 can be set to have a resistance value of about, for example, 33.33 KΩ.

Figure 3B:
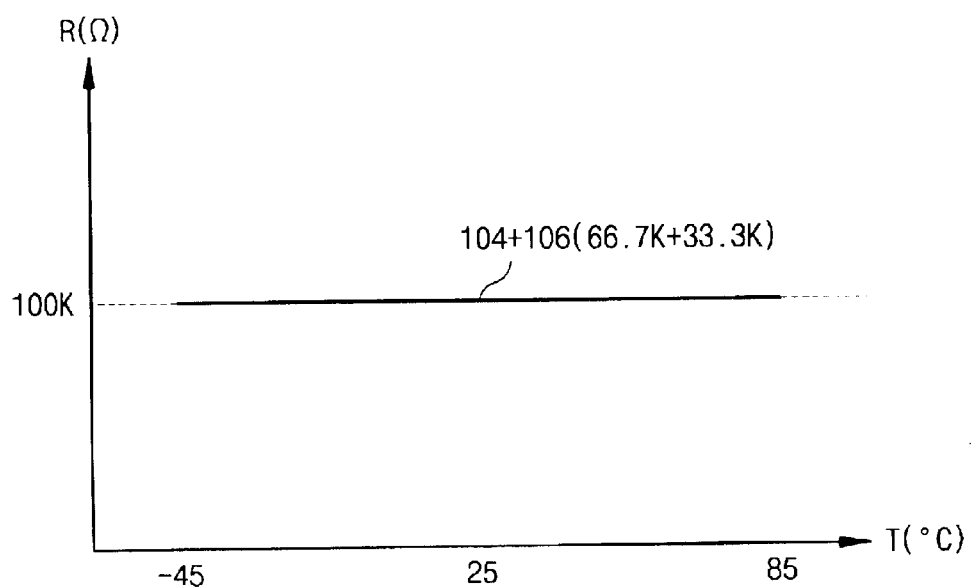
FIG. 3B is a diagram illustrating a sum of the resistance values of the resistive elements according to embodiments of the present invention as temperature varies.

By way of example, a resistance value of the first resistor 104 may be varied by 10 KΩ that corresponds to 15% of 66.7 KΩ, and a resistance value of the second resistor 106 may be varied by 10 KΩ that corresponds to −30% of 33.3 KΩ. As illustrated in FIG. 3B, a constant resistance value may be obtained irrespective of temperature variation, by using the first resistor 104 having a resistance value that varies in proportion to the temperature and the second resistor 106 having a resistance value that varies in inverse proportion to the temperature. Accordingly, a delay time may also be substantially constant irrespective of changes in temperature. A substantially constant delay time may make it possible to control a signal more accurately and more finely.

It will be understood that the delay circuit according to embodiments of the present invention may be included in many integrated circuit devices. For example, the delay circuit according to embodiments of the present invention may be used in a pulse generating circuit. The delay circuit of the present invention may also be included in an integrated circuit memory device using a floating gate transistor, for example, a flash memory device. For example, the delay circuit of the present invention can be used in a control circuit that controls operational timing of control signals of the flash memory device.

As a memory cell transistor, a floating gate transistor comprises a source, a drain, a floating gate, and a control gate. In general, the floating gate is used for storing charges and is formed of polysilicon that has a low impurity concentration, for example, polysilicon having an impurity concentration of from about $1 \times 10^{16}$ to about $1 \times 10^{18}$. The control gate is formed of polysilicon that has a high impurity concentration, for example, polysilicon having an impurity concentration of about $1 \times 10^{20}$. In a case where the delay circuit of the present invention is used in a flash memory device, the first resistor 104 of the delay circuit can be formed of a lightly doped polysilicon that is used to form the floating gate of the floating gate transistor. The second resistor 106 of the delay circuit can be formed of a highly doped polysilicon that is used to form the control gate of the floating gate transistor.

As described above with respect to FIGS. 1 through 3B, an integrated circuit device is provided that includes resistive means that has a substantially constant resistance value irrespective of temperature variation. In certain embodiments, the resistive means includes at least two polysilicon resistors and that are electrically coupled in series with a charge/discharge path of a capacitor. One of the two polysilicon resistors has a resistance value that is increased or decreased when a temperature is increased or decreased, i.e. in proportion to the temperature variation. The other of the two polysilicon transistors has a resistance value that is increased or decreased when a temperature is decreased or increased, i.e. inversely proportional to the temperature variation. A sum of the resistance values of the polysilicon resistors is substantially constant. Accordingly it is possible to constantly maintain a resistance value of the resistive means irrespective of the temperature variation.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A delay circuit comprising:
   an input terminal that receives an input signal;
   a first inverter that inverts the input signal;
   first and second resistors that are electrically coupled in series between an output of the first inverter and an internal node;
   a capacitor that is electrically coupled between the internal node and a ground voltage;
   a PMOS transistor that is electrically connected between a power supply voltage and the internal node and is controlled by the input signal;
   a detector having an input coupled to the internal node that detects whether a voltage of the internal node reaches a threshold voltage; and
   an output circuit that receives an output of the detector and the input signal and outputs a signal delayed by a time with respect to the input signal,
   wherein a resistance value of the first resistor varies in proportion to temperature variation and a resistance value of the second resistor varies in inverse proportion to the temperature variation.

2. The delay circuit according to claim 1, wherein the detector comprises a second inverter having the threshold voltage as a trip voltage.

3. The delay circuit of claim 1, wherein a sum of the first and second resistance values remains substantially constant as the temperature increases and/or decreases.

4. A delay circuit comprising:
   an input terminal that receives an input signal;
   a first resistive element coupled to the input terminal, the first resistive element having a first resistance value;
   a second resistive element having a second resistance value and being electrically coupled in series with the first resistive element, the first resistance value varying in proportion to temperature variation and the second resistance value varying in inverse proportion to the temperature variation;
   a detector coupled an output of the second resistive element that detects whether a voltage of an internal node reaches a threshold voltage; and
   an output circuit that receives an output of the detector and the input signal and outputs a signal delayed by a time with respect to the input signal.

5. The delay circuit of claim 4, further comprising:
   a first inverter that inverts the input signal;
   a capacitor that is electrically coupled between the internal node and a ground voltage; and a PMOS transistor that is electrically coupled between a power supply voltage and the internal node and is controlled by the input signal.

6. The delay circuit of claim 5, wherein the first and second resistive elements comprises first and second resistors, respectively, the first and second resistive elements being electrically coupled in series between an output of the first inverter and the internal node.

7. The delay circuit of claim 4, wherein the detector comprises a second inverter having the threshold voltage as a trip voltage.

8. The integrated circuit device according to claim 4, wherein a ratio of the first resistance value to the second resistance value is 2:1.

9. The delay circuit of claim 4, wherein the first resistive element comprises lightly doped polysilicon having an impurity concentration of from about $1\times10^{16}$ to about $1\times10^{18}$ and wherein the second resistive element comprises highly doped polysilicon having an impurity concentration of about $1\times10^{20}$.

* * * * *